(12) United States Patent
Otsuka et al.

(10) Patent No.: US 7,068,566 B2
(45) Date of Patent: Jun. 27, 2006

(54) SEMICONDUCTOR MEMORY DEVICE CAPABLE OF OUTPUTTING DATA WHEN A READ REQUEST NOT ACCOMPANIED WITH AN ADDRESS CHANGE BEING ISSUED

(75) Inventors: Eitaro Otsuka, Fujimi-machi (JP); Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 110 days.

(21) Appl. No.: 10/834,173

(22) Filed: Apr. 29, 2004

(65) Prior Publication Data

US 2005/0002268 A1   Jan. 6, 2005

(30) Foreign Application Priority Data

May 16, 2003   (JP) .............................. 2003-138289

(51) Int. Cl.
*G11C 8/00* (2006.01)
(52) U.S. Cl. ............ 365/233; 365/189.05; 365/189.07; 365/233.5
(58) Field of Classification Search ........... 365/189.01, 365/189.05 X, 189.07 X, 191, 194, 230.03, 365/233 O, 233.5 X
See application file for complete search history.

(56) References Cited

U.S. PATENT DOCUMENTS

| 5,623,447 | A | 4/1997 | Shimoda |
| 6,144,616 | A | 11/2000 | Suzuki et al. |
| 6,339,560 | B1 | 1/2002 | Naritake |
| 6,434,058 | B1 | 8/2002 | Kanazashi |
| 6,498,755 | B1 * | 12/2002 | Takahashi et al. ..... 365/189.07 |
| 6,545,943 | B1 | 4/2003 | Mizugaki et al. |
| 6,901,026 | B1 * | 5/2005 | Takeuchi et al. .......... 365/233.5 |
| 2002/0051389 | A1 | 5/2002 | Mizugaki et al. |
| 2004/0081006 | A1 | 4/2004 | Takahashi |
| 2004/0158671 | A1 | 8/2004 | Takahashi et al. |

FOREIGN PATENT DOCUMENTS

| JP | A-06-060632 | 3/1994 |
| JP | A-07-029378 | 1/1995 |
| JP | A-08-235852 | 9/1996 |
| JP | A-2000-260178 | 9/2000 |
| JP | A-2000-330967 | 11/2000 |
| JP | A-2001-273762 | 10/2001 |
| JP | 2002-133865 A | 5/2002 |
| JP | A-2002-367368 | 12/2002 |
| JP | A-2003-196975 | 7/2003 |
| JP | A-2004-145955 | 5/2004 |

* cited by examiner

*Primary Examiner*—VanThu Nguyen
(74) *Attorney, Agent, or Firm*—Oliff & Berridge, PLC

(57) ABSTRACT

The present invention provides a technique of causing a semiconductor device to output data if a read request not accompanied with an address change is issued. In a first situation in which a write request regarding a first data group is issued, a write operation of the first data group for a first group of memory cells among a set of memory cells selected by the current address is executed. When this occurs, a read operation of a second data group for a second group of memory cells among the set of memory cells is executed on a preliminary basis. The second group of memory cells is different from the first group of memory cells. In a second situation in which a read request for the second data group is issued while the current address is being maintained, the second data group that has been read preliminarily and held is externally output without executing a read operation for the second group of memory cells.

3 Claims, 9 Drawing Sheets

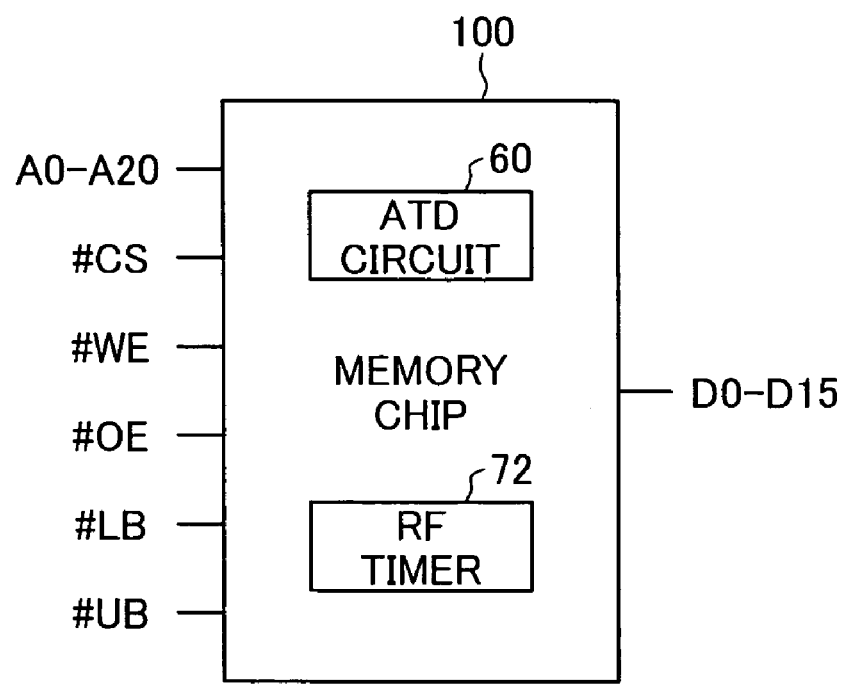

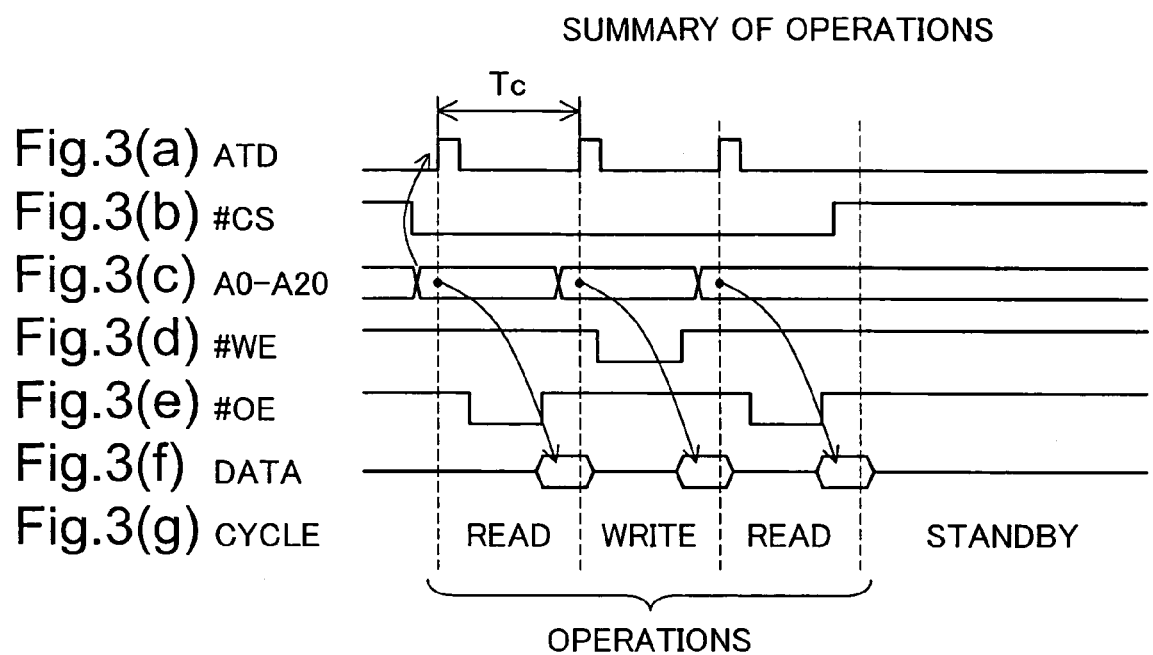

Fig.5

|  | EXTERNAL WRITE REQUEST (#WE "L") | | | EXTERNAL READ REQUEST (#WE "H") |
|---|---|---|---|---|
|  | #LB "L" #UB "L" | #LB "L" #UB "H" | #LB "H" #UB "L" | |
| LOWER BYTE | WRITE | WRITE | READ | READ |
| UPPER BYTE | WRITE | READ | WRITE | READ |

SEMICONDUCTOR MEMORY DEVICE CAPABLE OF OUTPUTTING DATA WHEN A READ REQUEST NOT ACCOMPANIED WITH AN ADDRESS CHANGE BEING ISSUED

BACKGROUND OF THE INVENTION

1. Field of the Invention

This invention relates to reading control in a semiconductor memory device.

2. Description of the Related Art

DRAM and SRAM are used as semiconductor memory devices. As is well known, DRAMs are cheaper and have a higher capacity than SRAMs, but must be refreshed. On the other hand, SRAMs need not be refreshed and are easier to use, but are more expensive and have a lower capacity than DRAMs.

A virtual SRAM (also termed a VSRAM or a PSRAM) is known as a semiconductor memory device that combines the advantages of a DRAM and an SRAM. A virtual SRAM includes a memory cell array that contains dynamic memory cells similar to those in a DRAM and has a built-in refresh controller, such that the refresh operation is performed internally. As a result, the external device (such as a CPU) connected to the virtual SRAM can access (read or write data to or from) the virtual SRAM without being aware of refresh operations. This feature of a virtual SRAM is known as "refresh transparency".

The virtual SRAM is described in U.S. Pat. No. 6,545,943 B2 disclosed by the applicants, for example.

In the conventional virtual SRAM, a read operation for a memory cell array is executed in response to a read request accompanied with an address change. Specifically, the conventional virtual SRAM determines that an external read request has been issued only if the read request given externally is accompanied with an address change, and executes a read operation. If the external read request does not accompany an address change, the read request is deemed to not have been issued, and no read operation is executed. For example, if a read request that does not accompany an address change is issued after the issuance of a write request, while a write operation corresponding to the write request is executed, a read operation corresponding to the subsequently-issued read request is not executed. As a result, in the case described above, the conventional virtual SRAM cannot output data in response to the subsequently-issued read request.

Furthermore when data is output, a generation of change in address is required for the execution of the read operation in a virtual SRAM as described above, but a generation of change in address is not required in an SRAM. As a result, it is desired that a virtual SRAM is capable of outputting data if a read request not accompanied with an address change is issued.

SUMMARY OF THE INVENTION

The object of the present invention is thus to provide a technique of causing a semiconductor device to output data if a read request not accompanied with an address change is issued.

At least part of the above and the other related objects is attained by a first apparatus of the present invention that is a semiconductor memory device. The semiconductor device comprises: a memory cell array having a plurality of memory cells; an address input section used for input of an address for selecting a set of memory cells among the plurality of memory cells; a data I/O section used for input or output of data corresponding to the set of memory cells selected by the address; and a controller that controls a write or read operation for the set of memory cells in response to a write or read request given externally. The data I/O section comprises: a holding section that holds data input externally and externally outputs the held data. The controller, (i) in a first situation in which the write request is issued, executes the write operation of data input externally for the set of memory cells selected by a current address and holds the data in the holding section, and (ii) in a second situation in which the read request is issued while the current address is being maintained, externally outputs the data held in the holding section without executing the read operation for the set of memory cells.

In this apparatus, when the external write request is issued, the data input externally is held in the holding section, and if the read request not accompanied with an address change is thereafter issued, the data held in the holding section is externally output. Namely, in this apparatus, correct data can be output to the outside without executing the read operation in response to the read request not accompanied with an address change.

In the above apparatus, the controller may further control the write or read operation for a group of memory cells corresponding to a specified data group in response to a specification request that is given externally and specifies input or output of a data group including at least part of the data corresponding to the set of memory cells. If the specification request for a particular data group is issued in the first situation, the controller may execute the write operation of the particular data group for a particular group of memory cells among the set of memory cells selected by the current address, and hold the particular data group in the holding section. If the specification request for the particular data group is issued in the second situation, the controller may externally output the particular data group held in the holding section without executing the read operation for the particular group of memory cells.

In this arrangement, even where the specification request specifying the particular data group from among data corresponding to the set memory cells is issued, the particular data group can be externally output in response to the read request not accompanied with an address change without executing the read operation for the particular group of memory cells.

The second apparatus of the present invention is a semiconductor memory device. The semiconductor memory device comprises: a memory cell array having a plurality of memory cells; an address input section used for input of an address for selecting a set of memory cells among the plurality of memory cells; a data I/O section used for input or output of data corresponding to the set of memory cells selected by the address; and a controller that, in response to a write or read request given externally and a specification request that is given externally and specifies input or output of a data group including at least part of the data corresponding to the set of memory cells, controls a write or read operation for a group of memory cells corresponding to the specified data group. The data I/O section comprises: a holding section that holds data input externally and externally outputs the held data. (i) In a first situation in which the write or read request is issued and the specification request for a first data group is issued, the controller executes the write or read operation of the first data group for a first group of memory cells among the set of memory cells selected by the current address, executes the read operation of a second data group for a second group of memory cells among the set of memory cells on a preliminary basis, and holds the second data group in the holding section, the second group of memory cells being different from the first group of memory cells. (ii) In a second situation in which the read request is issued while the current address is being maintained and the specification request for the second data group is issued, the controller externally outputs the second data group held in the holding section without executing the read operation for the second group of memory cells.

In this apparatus, when the write or read request for the first data group is issued, the read operation for the second group of memory cells is executed on a preliminary basis. The second group of memory cells is different from the first group of memory cells. Consequently, where the read request for the second data group is thereafter issued, the second data group that has been read preliminarily and held can be externally output. Namely, in this apparatus, correct data can be output to the outside in response to the read request not accompanied with an address change without executing the read operation.

In the above apparatus, the write request may be issued in the first situation. The controller may execute the write operation of the first data group and hold the first data group in the holding section in the first situation. If the specification request for the first data group is issued together with the specification request for the second data group in the second situation, the controller may externally output the first data group held in the holding section without executing the read operation for the first group of memory cells.

In this arrangement, where the first data group is held in the holding section in the first situation, if the read request for the first data group is issued in the second situation, the first data group can be externally output without executing the read operation.

Furthermore, the present invention may be realized in various forms, and may be realized in such forms as a semiconductor memory device, a semiconductor memory system that includes a semiconductor memory device and a control device, a reading control method for a semiconductor memory device, or an electronic apparatus that includes a semiconductor memory device, for example.

These and other objects, features, aspects, and advantages of the present invention will become more apparent from the following detailed description of the preferred embodiments with the accompanying drawings.

BRIEF DESCRIPTION OF THE DRAWINGS

FIG. 1 is an explanatory drawing showing terminal construction of a memory chip 100;

FIG. 2 is an explanatory drawing showing different operating state of the memory chip 100 in response to signal levels of chip select signal #CS;

FIGS. 3(a)–3(g) are timing charts showing basic operations performed by the memory chip 100;

FIG. 5 is an explanatory drawing showing operations performed to memory cell array if an external access request is issued;

DESCRIPTION OF THE PREFERRED EMBODIMENTS

Figure 4:
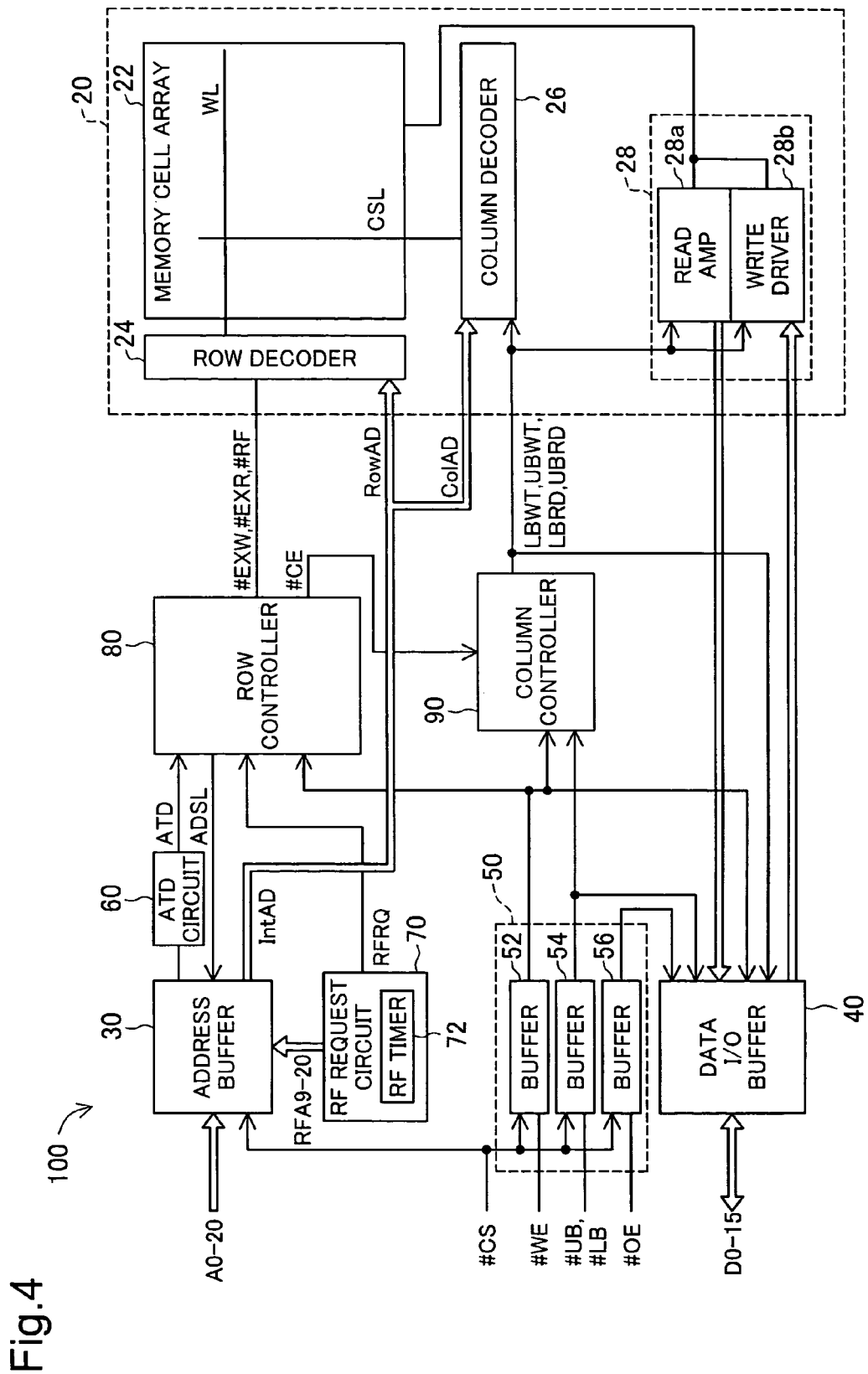
FIG. 4 is a block diagram showing general internal construction of the memory chip 100.

Embodiments of the present invention will be described below in the following order.
A. Summary of memory chip terminal construction and operating states
B. General internal construction of memory chip
C. Read control in response to external read request
D. Example of application to electronic apparatus A. Summary of memory chip terminal construction and operating states: FIG. 1 is an explanatory drawing showing the terminal construction of a memory chip 100. The memory chip 100 has the terminals listed below.
A0–A20: Address input terminals (21 terminals)
CS: Chip select input terminal
WE: Write enable input terminal
OE Output enable input terminal
LB: Lower byte enable input terminal
UB: Upper byte enable input terminal
D0–D15: I/O data terminals (16 terminals)

In the description below, the same symbols are used for terminal names and signal names. A symbol "#" preceding a terminal name (or signal name) denotes negative logic. While a plurality of address input terminals A0–A20 and I/O data terminals D0–D15 are provided, these are depicted in simplified fashion in FIG. 1.

The memory chip 100 is constructed as a virtual SRAM (VSRAM) that can be accessed using the same procedure as an ordinary asynchronous SRAM. However, because it uses dynamic memory cells, unlike an SRAM, it must be refreshed at predetermined intervals. A refresh controller including a refresh timer 72 is thus built into the memory chip 100. In this Specification, the operation to read or write data to or from an external device (control device) is termed "external access", while the refresh operation performed by the built-in refresh controller is termed "internal refresh" or simply "refresh".

The 21-bit address A0–A20 specifies a two megaword address, while the I/O data D0–D15 represents 16 bits of data for one word. In other words, one value of the address A0–A20 corresponds to 16 bits (one word), and the 16 bits of I/O data D0–D15 can be input or output at one time. As can be understood from this description, the memory chip 100 has memory cells with a 32 megabit capacity. In this embodiment, in the 21-bit address A0–A20, the upper 12-bit address, i.e., A9–A20, is used as a row address, and the lower 9-bit address, i.e. A0–A8, is used as a column address.

An address transition detection circuit (ATD circuit) 60 for detecting a change in an address is disposed inside the memory chip 100. If one or more bits of the 21-bit address A0–A20 has changed, an address transition detection signal (referred to as an "ATD signal" below) is generated. The circuitry in the memory chip 100 operates based on ATD signals.

The chip select signal #CS is a signal used to control the operating state of the memory chip 100. FIG. 2 is an explanatory drawing showing the different operating state of the memory chip 100 in response to the signal levels of the chip select signal #CS. In this Specification, "H" level refers to the "1" level among the two signal value levels, while "L" level refers to the "0" level.

When the chip select signal #CS is at L level (active), the read/write operation cycle (referred to below simply as "operation cycle" or "read/write cycle") is performed. During the operation cycle, external access can be performed, and internal refresh is performed at appropriate times.

When the chip select signal #CS is at H level (inactive), the memory chip 100 is set to a standby state. In the standby state, because external access is prohibited, all word lines are not activated. However, when internal refresh is performed, the word line specified by the refresh address is activated.

The refresh operation is performed according to a first refresh mode during the operation cycle and according to a second refresh mode during the standby state. In the first refresh mode, after the refresh timer 72 issues a refresh timing signal, the refresh operation is commenced on the condition that external access is not being performed. In the second refresh mode, the refresh operation starts immediately after the refresh timer 72 issues the refresh timing signal. In this way, the memory chip 100 carries out the proper refresh operation for whichever of the two operating states is active.

During the operation cycle, a write cycle is carried out when the write enable signal #WE is set to active (L level). When the write enable signal #WE is set to inactive (H level) and the output enable signal #OE is set to active (L level), a read cycle is carried out. The lower byte enable signal #LB and upper byte enable signal #UB are control signals used to command execution of input or output of only one byte among the upper byte or lower byte of one word (16 bits). For example, when the lower byte enable signal #LB is set to active (L level) and the upper byte enable signal #UB is set to inactive (H level), input or output of only the lower byte of one word is carried out. The power supply terminals are not shown in FIG. 1.

FIGS. 3(a)–3(g) are timing charts showing the basic operations performed by the memory chip 100. The determination as to which of the two operating states shown in FIG. 2 (operation, standby) is active is made from time to time in accordance with changes in the chip select signal #CS.

The first three cycles shown in FIGS. 3(a)–3(g) are operation cycles. During operation cycles, either reading (read cycle) or writing (write cycle) is performed in accordance with the levels of the write enable signal #WE and the output enable signal #OE. The shortest cycle Tc for the ATD signal (i.e., the shortest change cycle for the address A0–A20) corresponds to the cycle time for the memory chip 100 (hereinafter also termed the "cycle period"). The cycle time Tc is set to fall within a range of about 50 ns–100 ns, for example.

When the chip select signal #CS rises to H level, the memory chip 100 is set to standby state. No ATD signals are generated in the standby state, as shown in FIG. 3(a).

B. General internal construction of memory chip: FIG. 4 is a block diagram showing the general internal construction of the memory chip 100. The memory chip 100 comprises a memory block 20, an address buffer 30 and a data I/O buffer 40. The memory chip 100 further comprises a buffer block 50, the ATD circuit 60, a refresh request circuit 70 including a refresh timer 72, a row controller 80 and a column controller 90.

The row controller 80 and column controller 90 function as access controllers to control the external access operation, and the refresh request circuit 70 and row controller 80 function as refresh controllers to control the internal refresh operation.

The memory block 20 comprises a memory cell array 22, a row decoder 24, a column decoder 26 and a gate 28. The memory cell array 22 has the same construction as that of a memory cell array for a typical DRAM. Namely, in the memory cell array 22, a plurality of memory cells of the type having one transistor and one capacitor are arrayed in a matrix configuration. A word line WL and a pair of bit lines (also referred to as a "data line pair") CSL are connected to each memory cell. The row decoder 24 includes a row driver and selects and activates one of the plurality of word lines (4096) in the memory cell array 22 according to a given row address A9–A20. The column decoder 26 includes a column driver and simultaneously selects bit line pairs for one word (16 bits) among the plurality of bit line pairs (512×16) in the memory cell array 22 according to a given column address A0–A8. The gate 28 includes a read amplifier (reading circuit) 28a and a write driver (writing circuit) 28b, and enables data to be exchanged between the data I/O buffer 40 and the memory cell array 22. In addition, a precharge circuit, sense amplifier and other components not shown are also disposed in the memory block 20.

The address buffer 30 is a circuit that selects either the 21-bit address A0–A20 given from the external device or the 12-bit refresh address RFA9–RFA20 given from the refresh request circuit 70, and supplies the selected address to other internal circuits. The address buffer 30 selects one of the two types of address, i.e., A0–A20 or RFA9–RFA20, according to an address selection signal ADSL given from the row controller 80, and outputs the selected address as an internal address IntAD.

Specifically, if external access is performed, the address A0–A20 is selected as the internal address IntAD. When this is done, memory cells for one word (16 bits) are selected by the 12-bit row address RowAD (A9–A20) and the 9-bit column address ColAD (A0–A8). The data for one word (16 bits) corresponding to the selected memory cells is read or written via the data I/O buffer 40.

If internal refresh operation is carried out, on the other hand, the refresh address RFA9–RFA20 is selected as the internal address IntAD. When this is done, one word line is selected by the 12-bit row address RowAD (RFA9–RFA20), and a refresh operation is executed to the memory cells connected to the selected word line.

The buffer block 50 includes three buffers 52, 54, 56. The write enable signal #WE is input to the first buffer 52. The lower byte enable signal #LB and the upper byte enable signal #UB are input to the second buffer 54. The output enable signal #OE is input to the third buffer 56. The chip select signal #CS is supplied to each of the buffers 52, 54, 56. If the chip select signal #CS is active (L level) (i.e., during the operation cycle), the buffers 52, 54, 56 output the enable signals #WE, #LB, #UB, #OE to other internal circuits.

The ATD circuit 60 detects whether or not one or more bits of the 21-bit address A0–A20 supplied from the external device has changed, and generates a pulse-like ATD signal shown in FIG. 3(a) if a change is detected. The ATD signal is used to determine the timing of the internal operations of the memory chip.

The refresh request circuit 70 includes a refresh timer 72. The refresh timer 72 includes a ring oscillator, for example. The refresh period is set at about 32 µs, for example. The refresh request circuit 70 generates refresh request signals RFRQ using refresh timing signals output from the refresh timer 72. The refresh request signal indicates a request for the execution of a refresh operation. The refresh request circuit 70 further includes a 12-bit counter (not shown), and generates a refresh address RFA9–RFA20 in response to the issuance of a refresh timing signal.

The row controller 80 and the column controller 90 control external access. More specifically, the row controller 80 and the column controller 90 execute an external access operation (write operation or read operation) for the memory cell array in response to an access request given externally (a write request or a read request) so as not to interfere with refresh operation. The row controller 80 controls internal refresh operations. More specifically, the row controller 80 executes a refresh operation for the memory cell array in response to internally-generated refresh requests so as not to interfere with external access operation. As can be understood from this description, the row controller 80 arbitrates between external access and internal refresh operations.

The row controller 80 is supplied with the ATD signal, write enable signal #WE and refresh request signal RFRQ. In response to these signals, the row controller 80 outputs a write execution signal #EXW, a read execution signal #EXR, a refresh execution signal #RF and a column enable signal #CE. The arbitration between external access and internal refresh carried out by the row controller 80 is performed by setting the levels of the three execution signals #EXW, #EXR and #RF. The column enable signal #CE is set to active if either of the external access execution signals #EXW or #EXR is set to active.

Specifically, the row controller 80 determines that an external read request is issued if the write enable signal #WE has been set to inactive at the failing edge of the pulse-like ATD signal. The row controller 80 then sets the read execution signal #EXR to active on the condition that the write execution signal #WE and the refresh execution signal #RF are set to inactive.

Further, the row controller 80 determines that an external write request has been issued if the write enable signal #WE is set to active. The row controller 80 then sets the write execution signal #EXW to active on the condition that the read execution signal #EXR and the refresh execution signal #RF are set to inactive. While the write execution signal #EXW is set to active after the rising edge of the write enable signal #WE appears, it is acceptable if the write execution signal #EXW is set to active during the period that the write enable signal #WE is set to active.

Furthermore, the row controller 80 determines that a refresh request has been issued if the refresh request signal RFRQ is set to active. The row controller 80 then sets the refresh execution signal #RF to active on the condition that the read execution signal #EXR and the write execution signal #WE are set to inactive. Note that because the read execution signal #EXR and the write execution signal #WE are set to inactive at all times during the standby state, the refresh execution signal #RF is immediately set to active when a refresh request signal RFRQ is generated.

If either of the two external access execution signals #EXW and #EXR is set to active, the row decoder 24 activates one word line specified by the row address RowAD (A9–A20). When this is done, reading or writing of data is performed. If the refresh execution signal #RF is set to active, the row decoder 24 activates one word line specified by the row address RowAD (RFA9–RFA20). When this is done, the row of memory cells connected to the word line is refreshed.

The column controller 90 is supplied with the column enable signal #CE, write enable signal #WE, lower byte enable signal #LB and upper byte enable signal #UB. In response to these signals, the column controller 90 generates four types of gate signals LBWT, UBWT, LBRD and UBRD.

Specifically, the column controller 90 generates the gate signals described below only where the column enable signal #CE is set to active, i.e., only where an external access operation is performed. Specifically, if the write enable signal #WE is active and the lower byte enable signal #LB is active, the pulse-like lower byte write gate signal LBWT is generated. If the write enable signal #WE is active and the upper byte enable signal #UB is active, the pulse-like upper byte write gate signal UBWT is generated. Similarly, if the write enable signal #WE is inactive and the lower byte enable signal #LB is active, the pulse-like lower byte read gate signal LBRD is generated. If the write enable signal #WE is inactive and the upper byte enable signal #UB is active, the pulse-like upper byte read gate signal UBRD is generated.

If the column enable signal #CE is set to active, the column decoder 26 selects a plurality of bit line pairs in response to the column address ColAD (A0–A8) and the gate signals LBWT, UBWT, LBRD, UBRD. Specifically, sixteen candidate bit line pairs are determined by the column address ColAD (A0–A8) and at least eight bit line pairs among the candidates are selected by the gate signals. For example, if a lower byte write gate signal LBWT is generated, the lower eight bit line pairs of the sixteen bit line pairs are selected. If a lower byte write gate signal LBWT and an upper byte write gate signal UBWT are generated, the sixteen bit line pairs are selected.

When the bit line pairs are selected by the column decoder 26, the gate 28 performs data reading from or data writing to the memory cell array. Specifically, the read amplifier 28a reads data for each byte in response to the two types of read gate signals LBRD and UBRD. The write driver 28b writes data for each byte in response to the two types of write gate signals LBWT and UBWT.

C. Read control in response to external read request: In this embodiment, if an external write request is issued (i.e., where the write enable signal #WE is set to active), a write request is determined to be issued regardless of the generation of an address change, and thus the write execution signal #EXW is set to active. However, if an external read request is issued (i.e., where the write enable signal #WE is set to inactive), a read request is determined to be issued on the condition that it accompanies an address change. As a result, if an external read request not accompanied with an address change has been issued, the read execution signal #EXR cannot be set to active. Consequently, read operation for the memory cell array is not performed. In this embodiment, the memory chip is designed to enable data to be output without performing a read operation for the memory cell array even if an external read request not accompanied with an address change is issued.

FIG. 5 is an explanatory drawing showing the operations performed to the memory cell array if an external access request is issued. However, with regard to the read operation, only the operation performed if the read request accompanies an address change is shown.

If the write enable signal #WE is active (L level), i.e., where a write request has been issued, one of three types of operations is performed in response to the lower byte enable signal #LB and the upper byte enable signal #UB.

Specifically, if the lower byte enable signal #LB and the upper byte enable signal #UB are both active (L level), a write operation is performed to the sixteen memory cells corresponding to the upper and lower bytes.

If the lower byte enable signal #LB is active (L level) and the upper byte enable signal #UB is inactive (H level), a write operation is performed to the eight memory cells corresponding to the lower byte. At the same time, a read operation is performed to the eight memory cells corresponding to the upper byte.

Conversely, if the lower byte enable signal #LB is inactive (H level) and the upper byte enable signal #UB is active (L level), a write operation is performed to the eight memory cells corresponding to the upper byte. At the same time, a read operation is performed to the eight memory cells corresponding to the lower byte.

On the other hand, if the write enable signal #WE is inactive (H level) at the falling edge of the ATD signal, i.e., where a read request accompanied with an address change has been issued, a single type of operation is executed independently of the signal levels of the lower byte enable signal #LB and the upper byte enable signal #UB. Specifically, a read operation is performed to the sixteen memory cells corresponding to the upper and lower bytes.

Each of the operations shown in FIG. 5 is reached by the column controller 90 (see FIG. 4) generating two gate signals at each time when an external access operation is performed. Specifically, if only one of the two byte enable signals is active, the column controller 90 of this embodiment generates a byte read gate signal for the inactive byte. For example, if the write enable signal #WE is active (L level) and the lower byte enable signal #LB is active (L level), the column controller 90 generates a lower byte write gate signal LBWT and an upper byte read gate signal UBRD. As a result, if only one of the byte enable signals is active, an operation to read the data corresponding to the inactive byte can be performed on a preliminary basis.

Figure 6:
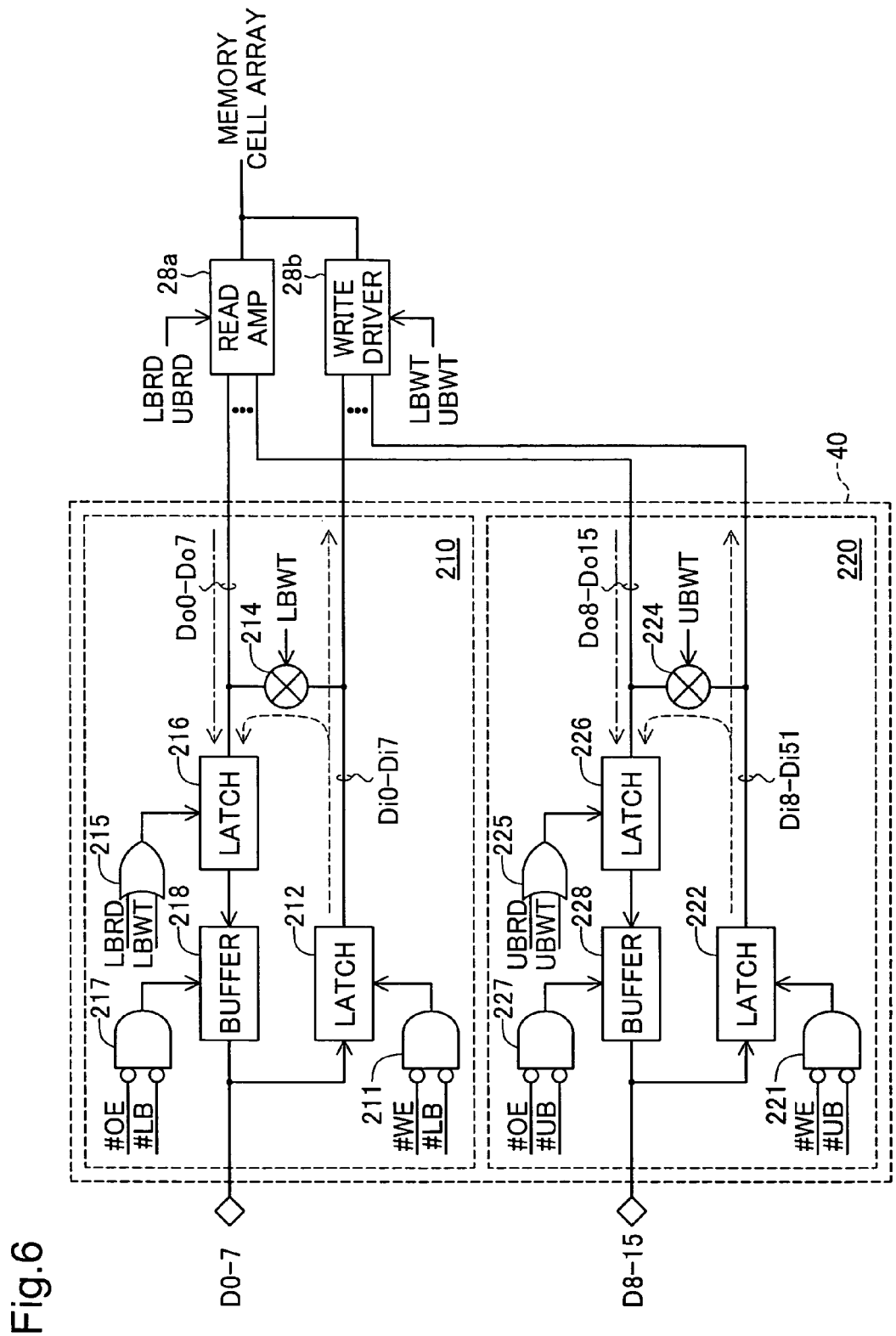
FIG. 6 is a block diagram showing an example of internal construction of data I/O buffer 40 shown in FIG. 4.

FIG. 6 is a block diagram showing an example of the internal construction of the data I/O buffer 40 shown in FIG. 4. As shown in FIG. 6, the data I/O buffer 40 includes lower byte I/o circuits 210 each of which is provided for each bit constituting the lower byte D0–D7, as well as upper byte I/O circuits 220 each of which is provided for each bit constituting the upper byte D8–D15. The read amplifier 28a and write driver of FIG. 4 are also shown in FIG. 6.

Each lower byte I/O circuit 210 includes two latch circuits 212 and 216, a switch circuit 214 and a buffer circuit 218. Each lower byte I/O circuit 210 further includes an inverse-input type AND gate 211 for controlling the first latch circuit 212, an OR gate 215 for controlling the second latch circuit 216, and an inverse-input type AND gate 217 for controlling the buffer circuit 218.

The first latch circuits 212 holds the data supplied from the lower byte data I/O terminals D0–D7 if a write request has been issued for the lower byte. Specifically, the first latch circuits 212 are set to the through state when the output of the inverse-input type AND gate 211 is at H level, and are set to the latch state when the output is at L level. If the two enable signals #WE and #LB are both set to active (L level), the first latch circuits 212 are set to the through state, and when the write enable signal #WE is thereafter set to inactive, the first latch circuits 212 are set to the latch state. When this is done, the input data Di0–Di7 is held in the first latch circuits 212. The first latch circuits 212 supply the input data Di0–Di7 to the write driver 28b. The write driver 28b writes the data Di0–Di7 to the memory cell array based on the generation of the lower byte write gate signal LBWT. The first latch circuits 212 also supply the input data Di0–Di7 to the switch circuits 214.

The switch circuits 214 are set to the open state when the lower byte write gate signal LBWT is active (H level). Namely, the input data Di0–Di7 output by the first latch circuits 212 is written to the memory cell array and is supplied to the second latch circuits 216 via the switch circuits 214.

The second latch circuits 216 hold the input data Di0–Di7 supplied by the switch circuits 214 or the memory data Do0–Do7 read by the read amplifier 28a. Specifically, the second latch circuits 216 are set to the through state when the output of the OR gate 215 is at H level, and are set to the latch state when the output of the OR gate 215 is at L level. If either of the gate signals LBWT and LBRD is set to active (H level), the second latch circuits 216 are set to the through state, and when the gate signals LBWT and LBRD are thereafter set to inactive, the second latch circuits 216 are set to the latch state. Consequently, if the write driver 28b is to write the data, the second latch circuits 216 can hold the input data Di0–Di7, and if the read amplifier 28a is to read the data, the second latch circuits 216 can hold the memory data Do0–Do7.

If a read request regarding the lower byte has been issued, the buffer circuits 218 output the data supplied by the second latch circuits 216 via the data I/O terminals D0–D7. Specifically, if the output of the inverse-input type AND gate 211 is at H level, i.e., if the output enable signal #OE and the lower byte enable signal #LB are set to active (L level), the buffer circuits 218 output the data supplied by the second latch circuits 216. Namely, if the input data Di0–Di7 is supplied by the second latch circuits 216, the buffer circuits 218 output the input data Di0–Di7, while if the memory data Do0–Do7 is supplied, the buffer circuits 218 outputs the memory data Do0–Do7.

Each upper byte I/O circuit 220 has the same construction as the lower byte I/O circuit 210. Specifically, each upper byte I/O circuit 220 includes two latch circuits 222 and 226, a switch circuit 224 and a buffer circuit 228. Each upper byte I/O circuit 220 further includes an inverse-input type AND gate 221 for controlling the first latch circuit 222, an OR gate 225 for controlling the second latch circuit 226, and an inverse-input type AND gate 227 for controlling the buffer circuit 228. However, in the upper byte I/O circuit 220, the upper byte write gate signal UBWT is supplied to the switch circuit 224. Further, the upper byte enable signal #UB is supplied to the two inverse-input type AND gates 221 and 227 in stead of the lower byte enable signal #LB. Furthermore, the upper byte write gate signal UBWT and the upper byte read gate signal UBRD are supplied to the OR gates 225 in stead of the lower byte write gate signal LBWT and the lower byte read gate signal LBRD.

As described above, the presence of the two latch circuits 216 and 226 in the data I/O buffer 40 enables data to be output without execution of a read operation even if a read request not accompanied with an address change has been issued.

FIGS. 7(a)–7(o), 8(a)–8(o) and 9(a)–9(o) are timing charts showing the various operations performed if a read request not accompanied with an address change is issued.

Figure 7:
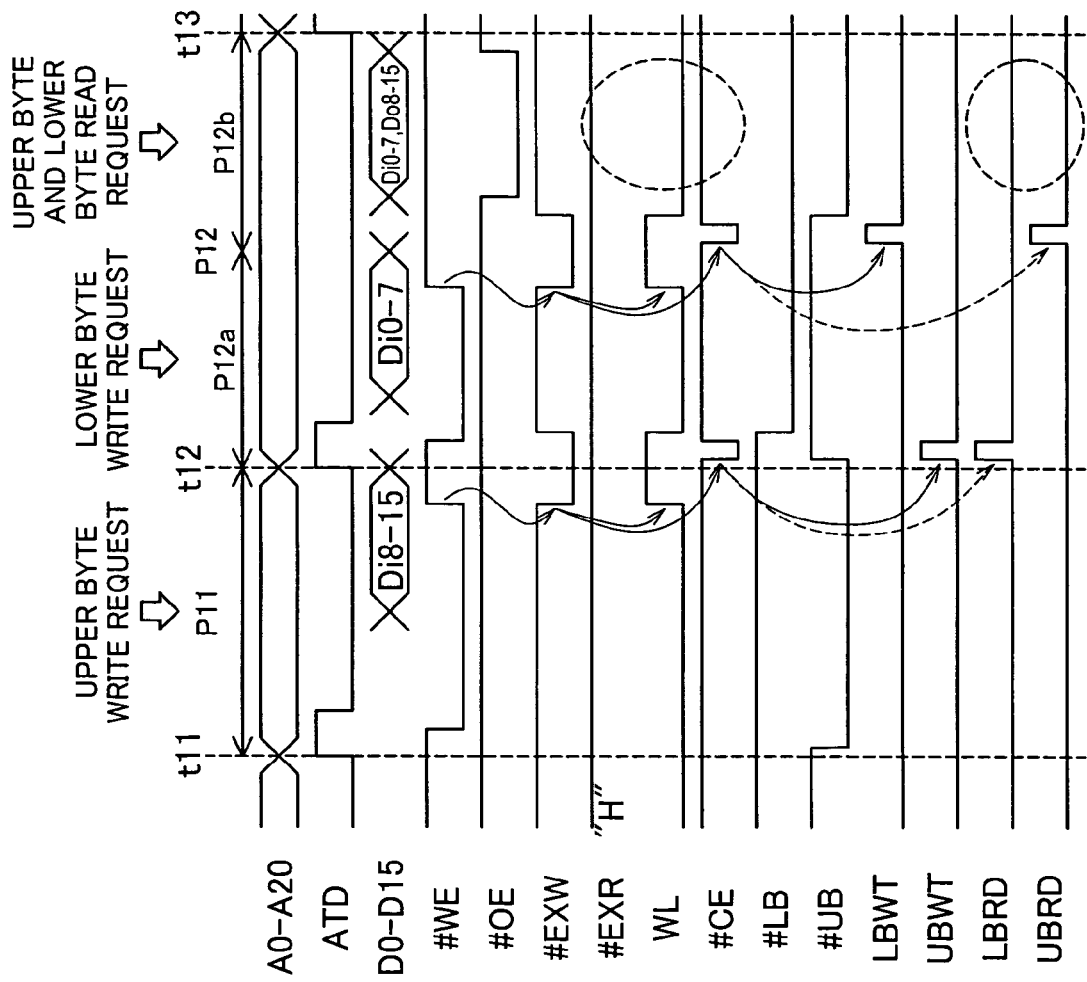
FIGS. 7(a)–7(o) are timing charts showing operations performed if a read request not accompanied with an address change is issued.

FIGS. 7(a)–7(o) show the operations performed when a read request for the lower and upper bytes is issued after a write request for the lower byte is issued. As shown in the drawing, when an address A0–A20 (see FIG. 7(*a*)) changes at the times t11 and t12, an ATD signal is generated (see FIG. 7(*b*)).

During the first period P11 beginning at the time t11, a write request for the upper byte is issued. Specifically, during the period P11, the write enable signal #WE (see FIG. 7(*d*)) and the upper byte enable signal #UB (see FIG. 7(*k*)) are both set to L level (active). Note that the output enable signal #OE (see FIG. 7(*e*)) and the lower byte enable signal #LB (see FIG. 7(*j*)) are both set to H level (inactive) during the period P11.

When the write enable signal #WE rises, write operation for the memory cell array starts. Specifically, the write execution signal #EXW (see FIG. 7(*f*)) is set to L level (active). When the write execution signal #EXW is set to L level, one word line WL (see FIG. 7(*h*)) selected by the row address A9–A20 is activated. Further, when the write execution signal #EXW is generated, the column enable signal #CE (see FIG. 7(*i*)) is set to active, and the pulse-like upper byte write gate signal UBWT (see FIG. 7(*m*)) is generated as a result. When this occurs, the upper eight bit line pairs are selected from the sixteen candidate bit line pairs which can be selected by the column address A0–A8. The write driver 28*b* writes the upper byte input data Di8–Di15 (see FIG. 7(*c*)) to the upper eight memory cells via the selected upper eight bit line pairs. In this way, write operation for the upper byte is performed.

Incidentally, in FIG. 7, in addition to the upper byte write gate signal UBWT, a lower byte read gate signal LBRD (see FIG. 7(*n*)) is generated in response to the issuance of a write request for the upper byte during the period P11. When this occurs, the read amplifier 28*a* reads the lower byte memory data Do0–Do7 from the lower eight memory cells via the lower eight bit line pairs. Namely, as described in connection with FIG. 5, if a write request for the upper byte is issued, a write operation is executed to the upper eight memory cells, and a read operation is executed to the lower eight memory cells on a preliminary basis.

During the second period P12 beginning at the time t12, after an address change occurs at the time t12, the address A0–A20 is maintained without any change. During the first-half period P12*a* of the period P12, a write request for the lower byte is issued, and during the second-half period P12*b*, a read request for both the upper and lower bytes is issued. Specifically, during the first-half period 12*a*, the write enable signal #WE and the lower byte enable signal #LB are both set to active (L level). During the second-half period P12*b*, the write enable signal #WE is set to inactive (H level) and the output enable signal #OE and the two byte enable signals #UB, #LB are set to active (L level).

The operations executed during the first-half period P12*a* are similar to those executed during the period P11. However, because a write request for the lower byte is issued during the first-half period P12*a*, a lower byte write gate signal LBWT (see FIG. 7(*l*)) is issued. Further, an upper byte read gate signal UBRD (see FIG. 7(*o*)) is issued simultaneously with the lower byte write gate signal LBWT.

While a read request for the lower and upper bytes is issued during the second-half period P12*b*, this read request does not accompany an address change. No read operation is thus executed to the memory cell array in response to the read request. Specifically, no ATD signal is generated where the read request does not accompany an address change. At this time, because the read execution signal #EXR (see FIG. 7(*g*)) is maintained at inactive, the word lines WL are maintained in the non-activated state. Further, because the column enable signal #CE is also maintained at inactive, neither of the read gate signals UBRD or LBRD is generated.

However, during the first-half period P12*a* shown in FIGS. 7(*a*)–7(*o*), a write operation is executed to the lower byte in response to a lower byte write request, and the lower byte input data Di0–Di7 is held in the second latch circuits 216 in the lower byte I/O circuits 210. Further, in FIGS. 7(*a*)–7(*o*), a read operation for the upper byte is executed on a preliminary basis during the first-half period P12*a* in response to the lower byte write request. As a result, the upper byte memory data Do8–Do15 is read from the memory cell array and is held in the second latch circuits 226 in the upper byte I/O circuits 220.

Consequently, correct data can be output in response to the read request for the lower and upper bytes during the second-half period P12*b*. Specifically, during the second-half period P12*b*, the lower byte input data Di0–Di7 held during the first-half period P12*a* is output from the memory chip 100, and the upper byte memory data Do8–Do15 read on a preliminary basis and held during the first-half period P12*a* is output from the memory chip 100.

Figure 8:
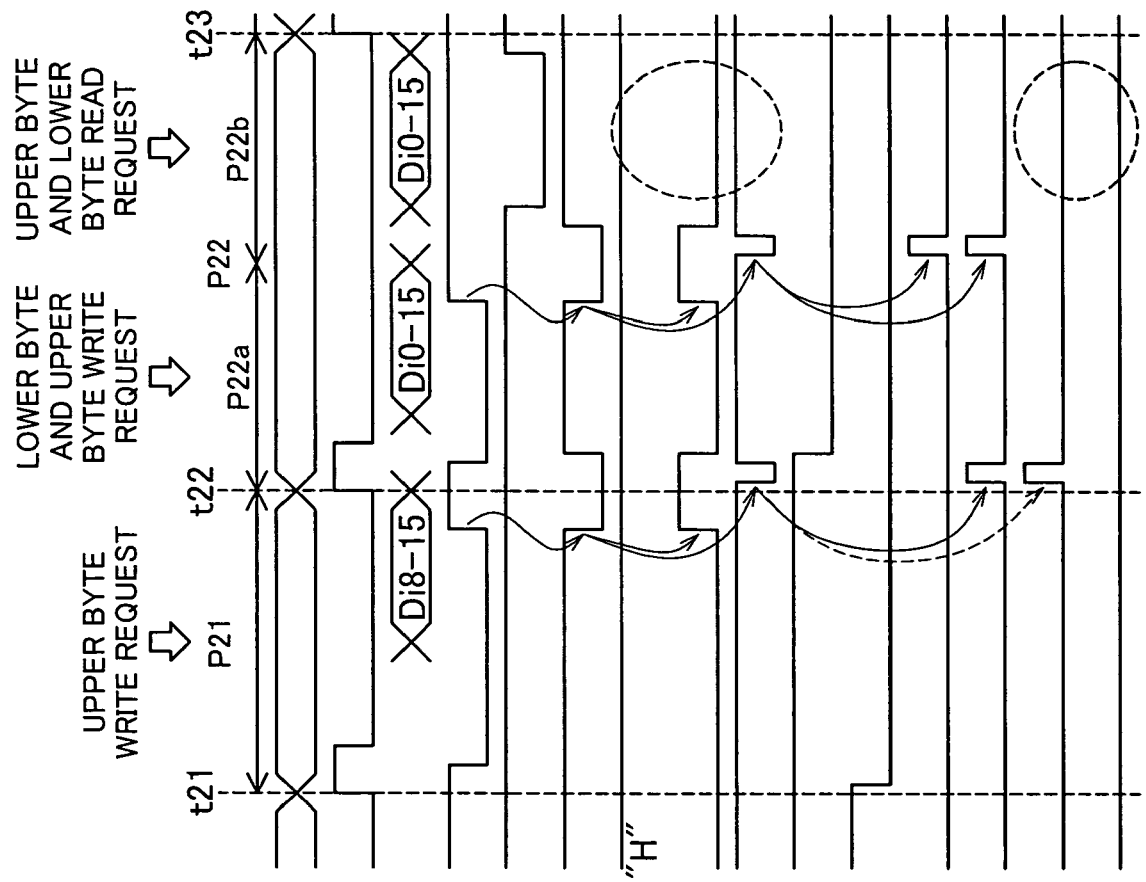
FIGS. 8(a)–8(o) are timing charts showing operations performed if a read request not accompanied with an address change is issued.

FIGS. 8(*a*)–8(*o*) show the operations performed when a read request for the lower and upper bytes is issued after a write request for the lower and upper bytes is issued. The operations executed during the period P21 beginning at the time t21 are the same as the operations executed during the period P11 shown in FIGS. 7(*a*)–7(*o*).

During the second period P22 beginning at the time t22, after an address change occurs at the time t22, the address A0–A20 is maintained without any change. During the first-half period P22*a* of the period P22, a write request for the lower and upper bytes is issued, and during the second-half period P22*b*, a read request for the lower and upper bytes is issued. Specifically, during the first-half period 22*a*, the write enable signal #WE and the two byte enable signals #LB, #UB are set to active (L level). During the second-half period P22*b*, the write enable signal #WE is set to inactive (H level) and the output enable signal #OE and the two byte enable signals #UB, #LB are set to active (L level).

During the first-half period P22*a*, a lower byte write gate signal LBWT is issued in response to the lower byte write request and an upper byte write gate signal UBWT is issued in response to the upper byte write request. Namely, as described in connection with FIG. 5, if a write request for the lower and upper bytes is issued, a write operation is executed to the sixteen memory cells.

During the second-half period 22*b*, a read request for the lower and upper bytes is issued, but this read request does not accompany an address change. No read operation is thus executed to the memory cell array in response to the read request.

However, during the first-half period 22*a* shown in FIGS. 8(*a*)–8(*o*), a lower byte write operation is executed in response to the lower byte write request, and the lower byte input data Di0–Di7 is held in the second latch circuits 216 of the lower byte I/O circuits 210. Further, an upper byte write operation is executed in response to the upper byte write request, and the upper byte input data Di8–Di15 is held in the second latch circuits 226 of the upper byte I/O circuits 220.

Consequently, correct data can be output in response to the read request for the lower and upper bytes during the second-half period P22*b*. Specifically, during the second-half period P22*b*, the lower byte input data Di0–Di7 held during the first-half period P22*a* is output from the memory chip 100, and the upper byte input data Di8–Di15 held during the first-half period P22*a* is output from the memory chip 100.

Figure 9:
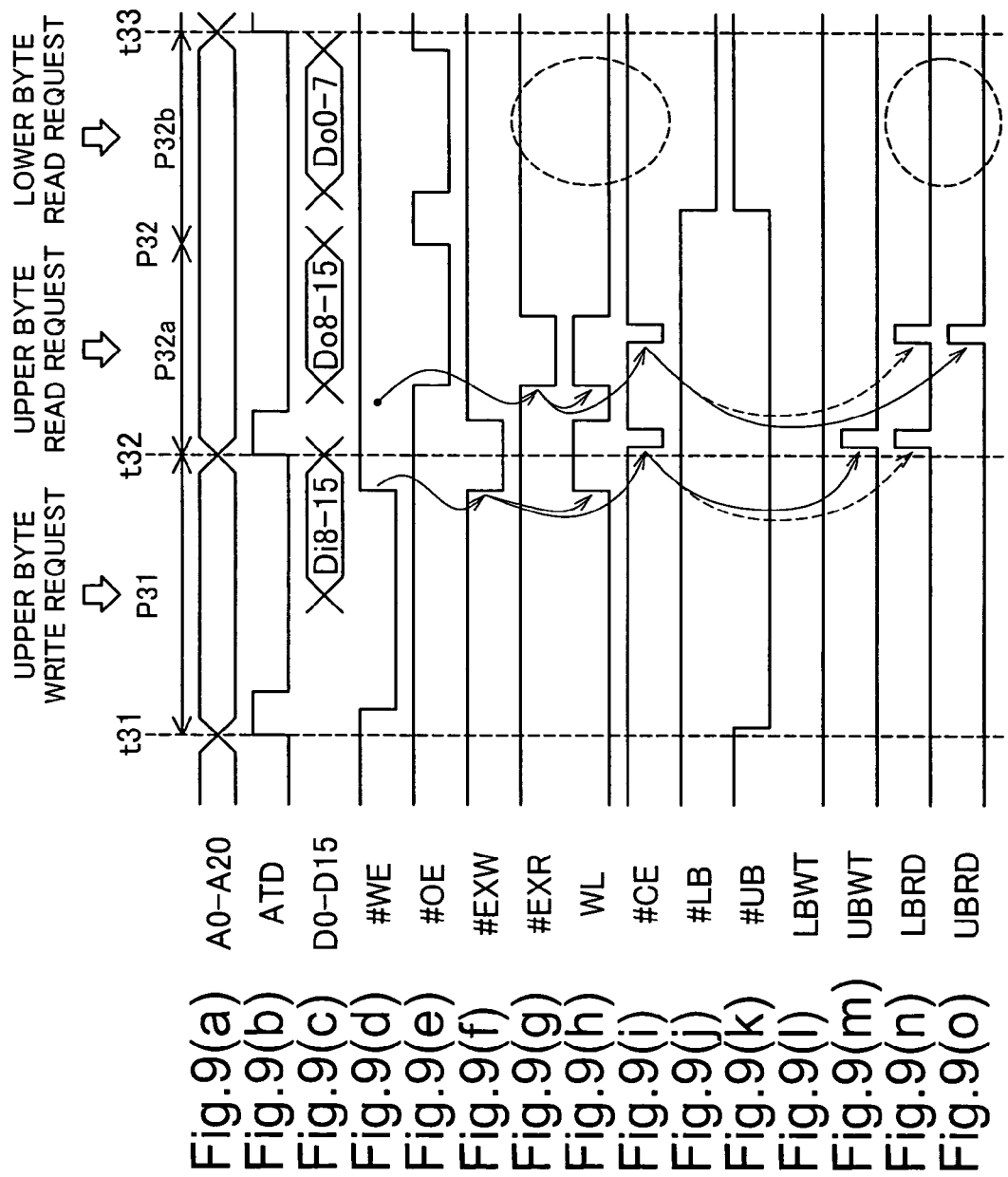
FIGS. 9(a)–9(o) are timing charts showing operations performed if a read request not accompanied with an address change is issued.

FIGS. 9(*a*)–9(*o*) show the operations performed when a read request for the lower byte is issued after a read request for the upper byte is issued. The operations executed during the period P31 beginning at the time t31 are the same as the operations executed during the period P11 shown in FIG. 7(*a*)–7(*o*).

During the second period P32 beginning at the time t32, after an address change occurs at the time t32, the address A0–A20 is maintained without any change. During the first-half period P32*a* of the period P32, a write request for the upper byte is issued, and during the second-half period P32*b*, a read request for the lower byte is issued. Specifically, during the first-half period 32*a*, the write enable signal #WE is set to inactive (H level), and the output enable signal #OE and the upper byte enable signal #UB are set to active (L level). During the second-half period P32*b*, the write enable signal #WE is set to inactive (H level), and the output enable signal #OE and the lower byte enable signals #LB are set to active (L level).

During the first-half period P32*a*, because the write enable signal #WE is at H level (inactive) at the falling edge of the ATD signal, read operation for the memory cell array starts. Specifically, the read execution signal #EXR is set to L level (active). When the read execution signal #EXR is set to L level, one word line WL is activated by the row address A9–A20. Moreover, when the read execution signal #EXR is generated, the column enable signal #CE is set to active, and a pulse-like upper byte read gate signal UBRD is generated as a result. When this occurs, the upper eight bit line pairs are selected from the sixteen candidate bit line pairs which can be selected by the column address A0–A8. The read amplifier 28*a* reads the upper byte memory data Do8–Do15 from the upper eight memory cells via the selected upper eight bit line pairs. In this way, read operation for the upper byte is performed.

Incidentally, in FIG. 9, in addition to the upper byte read gate signal UBRD, a lower byte read gate signal LBRD is generated in response to the issuance of a read request for the upper byte during the first-half period P32*a*. When this occurs, the read amplifier 28*a* reads the lower byte memory data Do0–Do7 from the lower eight memory cells via the lower eight bit line pairs. Namely, as described in connection with FIG. 5, if a read request for the upper byte is issued, a read operation is executed to the upper eight memory cells, and a read operation is executed to the lower eight memory cells on a preliminary basis.

While a read request for the lower byte is issued during the second-half period P32*b*, this read request does not accompany an address change. No read operation is thus executed to the memory cell array in response to the read request.

However, during the first-half period 32*a* shown in FIG. 9, an upper byte read operation is performed in response to the upper byte read request, and a lower byte read operation is performed. As a result, the lower byte memory data Do0–Do7 is read from the memory cell array and held in the second latch circuits 216 of the lower byte I/O circuits 210.

Consequently, correct data can be output in response to the read request for the lower byte during the second-half period 32*b*. Specifically, during the second-half period P32*b*, the lower byte data Do0–Do7 read and held during the first-half period P32*a* is output from the memory chip 100.

While a read request is issued for the lower byte only during the second-half period P32*b* in FIG. 9, correct data can be output even if a read request is also issued for the upper byte as well. This is because when the upper byte read operation is executed in response to the upper byte read request during the first-half period 32*a*, the upper byte memory data Do8-Do15 is held in the second latch circuits 226 of the upper byte I/O circuits 220.

As described in connection with FIGS. 7(*a*)–7(*o*) and 8(*a*)–8(*o*), in this embodiment, when a write request for the first byte is issued, a write operation is executed regarding first data with respect to the eight memory cells corresponding to the first byte among the sixteen memory cells selected in accordance with the current address, and the first data is held in the second latch circuits 216 or 226 of the data I/O buffer 40. Consequently, if a read request is thereafter issued regarding the first byte while the current address is being maintained, the held first data can be output to the outside.

As described in connection with FIGS. 7(*a*)–7(*o*) and 9(*a*)–9(*o*), in this embodiment, when a write request or a read request for the first byte is issued, a write operation or a read operation is executed regarding first data with respect to the eight memory cells corresponding to the first byte among the sixteen memory cells selected in accordance with the current address. When this occurs, a read operation regarding second data is executed on a preliminary basis with respect to the other eight memory cells corresponding to the second byte. The read second data is then held in the second latch circuits 216 or 226 of the data I/O buffer 40. Consequently, if a read request is issued for the second byte while the current address is being maintained, the held second data can be output to the outside.

As described above, correct data can be output in response to a read request not accompanied with an address change without the execution of a read operation. In other words, a read operation for memory cells is executed only where a read request accompanied with an address change is issued, and a read operation for memory cells can be omitted where a read request not accompanied with an address change is issued.

Figure 10:
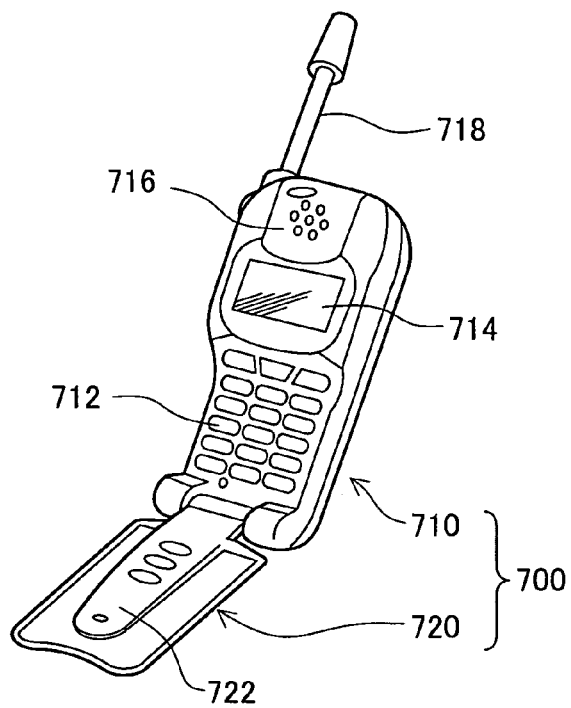
FIG. 10 is a perspective view of a mobile phone by way of an exemplary electronic device embodying the semiconductor memory device of this invention.

D. Example of application to electronic apparatus: FIG. 10 is a perspective view of a mobile phone by way of an exemplary electronic device embodying the semiconductor memory device of this invention. Mobile phone 700 comprises a body 710 and a cover 720. Body 710 is provided with a keyboard 712, a liquid crystal display 714, a receiver 716, and a body antenna 718. Cover 720 is provided with a transmitter 722.

Figure 11:
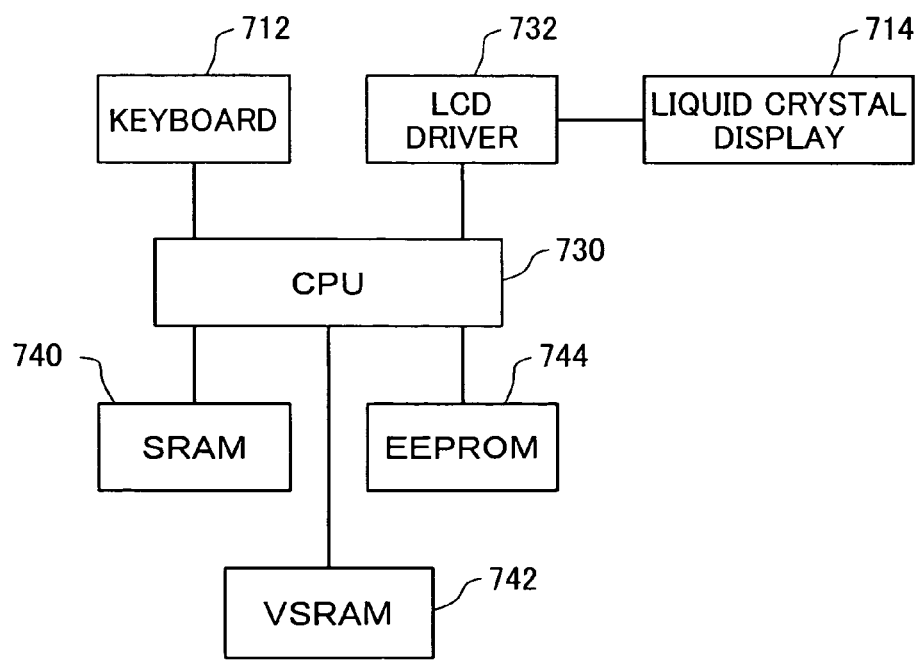
FIG. 11 is a block diagram of the electronics of the mobile phone 700 of FIG. 10.

FIG. 11 is a block diagram of the electronics of the mobile phone 700 of FIG. 10. CPU 730 is connected via a bus line to keyboard 712, an LCD driver 732 for driving liquid crystal display 714, an SRAM 740, a VSRAM 742 and an EEPROM 744.

SRAM 740 is used as a high speed cache memory, for example. VRAM 742 is used as a working memory for image processing, for example. Memory chip 100 may be used for VSRAM 742 (referred to as virtual SRAM or pseudo SRAM). EEPROM 744 is used for containing various settings for the mobile phone 700.

When operation of mobile phone 700 is temporarily suspended, VSRAM 742 may be maintained in standby state. By so doing, internal refresh operations in VSRAM 742 will be performed automatically, enabling data in VSRAM 742 to be preserved. As the memory chip 100 of the embodiment has relatively large capacity, large amounts of data such as image data can be held for extended periods. Further, the memory chip 100 of the embodiment can be accessed without being aware of refresh operations, similar to an SRAM.

The invention is not limited to the examples and embodiments set forth hereinabove, various modifications thereof being possible without departing from the scope and spirit of the invention. Modifications such as the following are possible, for example.

(1) While the two byte enable signals #LB and #UB are used in the above embodiment, three or more byte enable signals may be used. In this case, it is preferable that a write operation or read operation is executed regarding the byte specified by an active byte enable signal and that a read operation is executed regarding the byte specified by an inactive byte enable signal.

While the two byte enable signals #LB and #UB are used in the above embodiment, only one byte enable signal may be used. For example, where only the lower byte enable signal #LB is used, if the signal #LB is active, the lower byte I/O is specified, while if the signal #LB is inactive, both the lower byte and upper byte I/O is specified. Where a lower byte write request is issued (i.e., where the signal #LB is active), a write operation for the lower byte is executed and a read operation for the upper byte is executed on a preliminary basis. Where a lower and upper bytes read request not accompanied with an address change is thereafter issued (i.e., where the signal #LB is active), the held input data should be output as lower byte data, and the memory data that was read on a preliminary basis and held should be output as upper byte data without the execution of a read operation.

In general, in a first situation in which a write request or a read request is issued and a request specifying a first data group is issued, a write operation or read operation of the first data group should be executed with respect to a first group of memory cells and a read operation of a second data group should be executed with respect to a second group of memory cells, which is different from the first group of memory cells, on a preliminary basis. In a second situation in which a read operation is thereafter issued while the current address is being maintained and a request specifying the second data group is issued, the second data group that has been read preliminarily and held should be output to the outside without executing a read operation with respect to the second group of memory cells.

(2) While the two byte enable signals #LB and #UB are used in the above embodiment, it is acceptable if no byte enable signals are used. In this case, a write operation may be executed in response to an external write request, and the input data may be held. If this is done, the held data can subsequently be output in response to an external read request not accompanied with an address change.

In general, in a first situation in which a write request is issued, a write operation of data input externally should be executed with respect to a set of memory cells selected by the current address while this data should be held in a holding section. In a second situation in which a read request is issued while the current address is being maintained, the data held in the holding section should be output to the outside without executing a read operation with respect to the above set of memory cells.

(3) While the above embodiment was described using the application of the present invention in a virtual SRAM, the present invention may be applied in a different type of memory device, such as an SRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array having a plurality of memory cells;
   an address input section used for input of an address for selecting a set of memory cells among the plurality of memory cells;
   a data I/O section used for input or output of data corresponding to the set of memory cells selected by the address, the data I/O section including a holding section that holds data input externally and externally outputs the held data; and
   a controller that, in response to a write or read request given externally and a specification request that is given externally and specifies input or output of a data group including at least part of the data corresponding to the set of memory cells, controls a write or read operation for a group of memory cells corresponding to the specified data group,
   wherein the controller,
      (i) in a first situation in which the write or read request is issued and the specification request for a first data group is issued, executes the write or read operation of the first data group for a first group of memory cells among the set of memory cells selected by the current address, executes the read operation of a second data group for a second group of memory cells among the set of memory cells on a preliminary basis, and holds the second data group in the holding section, the second group of memory cells being different from the first group of memory cells, and
      (ii) in a second situation in which the read request is issued while the current address is being maintained and the specification request for the second data group is issued, externally outputs the second data group held in the holding section without executing the read operation for the second group of memory cells.

2. The semiconductor memory device according to claim 1, wherein the write request is issued in the first situation, and
   and wherein the controller
   executes the write operation of the first data group and holds the first data group in the holding section in the first situation, and
   if the specification request for the first data group is issued together with the specification request for the second data group in the second situation, externally outputs the first data group held in the holding section without executing the read operation for the first group of memory cells.

3. An electronic apparatus comprising:
   the semiconductor memory device according to claim 1; and
   an external controller that controls the semiconductor memory device.

* * * * *